United States Patent
Rowett

(10) Patent No.: US 9,921,757 B1
(45) Date of Patent: Mar. 20, 2018

(54) USING AN FPGA FOR INTEGRATION WITH LOW-LATENCY, NON-VOLATILE MEMORY

(71) Applicant: EMC IP Holding Company LLC, Hopkinton, MA (US)

(72) Inventor: Kevin Rowett, Cupertino, CA (US)

(73) Assignee: EMC IP Holding Company LLC, Hopkinton, MA (US)

(*) Notice: Subject to any disclaimer, the term of this patent is extended or adjusted under 35 U.S.C. 154(b) by 2 days.

(21) Appl. No.: 15/087,948

(22) Filed: Mar. 31, 2016

(51) Int. Cl.
| | | |
|---|---|---|
| G06F 9/45 | (2006.01) | |
| G06F 12/08 | (2016.01) | |
| G06F 12/0808 | (2016.01) | |
| G06F 12/0815 | (2016.01) | |
| G06F 3/06 | (2006.01) | |
| G06F 13/40 | (2006.01) | |
| G06F 12/0802 | (2016.01) | |
| G06F 11/10 | (2006.01) | |
| G11C 29/52 | (2006.01) | |

(52) U.S. Cl.
CPC .......... *G06F 3/0611* (2013.01); *G06F 3/0604* (2013.01); *G06F 3/0616* (2013.01); *G06F 3/0647* (2013.01); *G06F 3/0685* (2013.01); *G06F 11/1068* (2013.01); *G06F 12/0802* (2013.01); *G06F 13/4068* (2013.01); *G11C 29/52* (2013.01); *G06F 2212/60* (2013.01)

(58) Field of Classification Search
CPC .... G06F 3/0673; G06F 3/0611; G06F 3/0659; G06F 11/22
USPC ........................................................ 711/103
See application file for complete search history.

(56) References Cited

U.S. PATENT DOCUMENTS

| | | | | |
|---|---|---|---|---|
| 6,782,410 B1 * | 8/2004 | Bhagat | .................. | G06F 9/5027 709/201 |
| 6,842,377 B2 * | 1/2005 | Takano | ................ | G11C 7/1021 365/185.21 |
| 7,017,011 B2 * | 3/2006 | Lesmanne | ............. | G06F 12/082 711/141 |
| 7,196,942 B2 * | 3/2007 | Khurana | .............. | G11C 7/1051 326/38 |
| 7,269,715 B2 * | 9/2007 | Le | .......................... | G06F 9/3802 712/215 |
| 7,321,955 B2 * | 1/2008 | Ohmura | .............. | G06F 12/0804 711/113 |

(Continued)

OTHER PUBLICATIONS

Author Unknown, PMC, Flashtec, PCLE Flash Controllers, Product Brief, Flashtec NVMe2032 & NVMe2016 Controllers, 32 and 16 Channel PCI Express Flash Controller Products, 2015, Issue 2.

(Continued)

*Primary Examiner* — Tuan Thai
*Assistant Examiner* — Mohamed Gebril
(74) *Attorney, Agent, or Firm* — Van Pelt, Yi & James LLP

(57) ABSTRACT

A plurality of programmable logic blocks are programmed in a first configuration to perform one or both of an access function and a management function with respect to a plurality of non-volatile memory modules. A high data transfer rate connection is provided to an external random access memory device, wherein said at least a subset of said programmable logic blocks are programmed in said first configuration to perform one or both of said access function and said management function at least in part using data sent via a communication interface, wherein the communication interface is coupled to at least a subset of said programmable logic blocks.

18 Claims, 5 Drawing Sheets

(56) References Cited

U.S. PATENT DOCUMENTS

| | | | | |
|---|---|---|---|---|
| 7,512,736 B1* | 3/2009 | Overby | G06F 3/0607 | 707/999.202 |
| 8,230,193 B2* | 7/2012 | Klemm | G06F 3/0608 | 711/114 |
| 8,566,546 B1* | 10/2013 | Marshak | G06F 3/0604 | 711/112 |
| 8,990,527 B1* | 3/2015 | Linstead | G06F 3/0617 | 711/161 |
| 2001/0052038 A1* | 12/2001 | Fallon | G06F 3/0613 | 710/68 |
| 2003/0084244 A1* | 5/2003 | Paulraj | G06F 12/0864 | 711/118 |
| 2004/0068621 A1* | 4/2004 | Van Doren | G06F 12/0828 | 711/144 |
| 2005/0125607 A1* | 6/2005 | Chefalas | G06F 12/0862 | 711/113 |
| 2006/0202999 A1* | 9/2006 | Thornton | G06F 12/145 | 345/531 |
| 2007/0008328 A1* | 1/2007 | MacWilliams | G06F 12/0646 | 345/530 |
| 2009/0094413 A1* | 4/2009 | Lehr | G06F 3/0605 | 711/112 |
| 2009/0228648 A1* | 9/2009 | Wack | G06F 11/1092 | 711/114 |
| 2009/0282101 A1* | 11/2009 | Lim | G06F 9/5077 | 709/203 |
| 2010/0046267 A1* | 2/2010 | Yan | G11C 16/24 | 365/51 |
| 2010/0050016 A1* | 2/2010 | Franklin | G06F 11/0727 | 714/6.32 |
| 2010/0125712 A1* | 5/2010 | Murase | G06F 11/1458 | 711/162 |
| 2010/0142243 A1* | 6/2010 | Baxter | G11O 5/02 | 365/51 |
| 2010/0241785 A1* | 9/2010 | Chen | G06F 9/5016 | 711/6 |
| 2010/0332780 A1* | 12/2010 | Furuya | G06F 3/0689 | 711/162 |
| 2011/0202735 A1* | 8/2011 | Kono | G06F 11/1451 | 711/162 |
| 2011/0307745 A1* | 12/2011 | McCune | G06F 17/30221 | 714/54 |
| 2012/0110293 A1* | 5/2012 | Yang | G06F 9/45558 | 711/170 |
| 2012/0198107 A1* | 8/2012 | McKean | G06F 13/18 | 710/40 |
| 2013/0007373 A1* | 1/2013 | Beckmann | G06F 12/126 | 711/136 |
| 2013/0067161 A1* | 3/2013 | Chandra | G06F 13/12 | 711/114 |
| 2013/0080805 A1* | 3/2013 | Vick | G06F 8/4432 | 713/320 |
| 2013/0111129 A1* | 5/2013 | Maki | G06F 3/0611 | 711/117 |
| 2013/0152097 A1* | 6/2013 | Boctor | G06F 9/505 | 718/103 |
| 2013/0326270 A1* | 12/2013 | Chen | G06F 11/2089 | 714/6.21 |
| 2014/0003114 A1* | 1/2014 | Pellizzer | H01L 27/2481 | 365/63 |
| 2016/0217835 A1* | 7/2016 | Blott | G11C 7/1057 | |
| 2016/0313914 A1* | 10/2016 | Koets | G06F 3/061 | |
| 2017/0123995 A1* | 5/2017 | Freyensee | G06F 12/10 | |

OTHER PUBLICATIONS

Author Unknown, Xilinx, Spartan-6 FPGA Memory Controller User Guide, UG388 (v2.3) Aug. 9, 2013.

* cited by examiner

USING AN FPGA FOR INTEGRATION WITH LOW-LATENCY, NON-VOLATILE MEMORY

BACKGROUND OF THE INVENTION

Non-volatile memory (NVM) provides a benefit to a user in that it can retrieve and retain stored information even after a power cycle. Non-volatile memory is typically used for secondary or tertiary storage as it provides lower performance including higher latency and/or lower throughput over volatile dynamic random access memory (DRAM).

Novel NVM technologies may improve performance by lowering latency, but may require ancillary challenges to be properly used or harness the lower latency and/or higher throughput. Any integration with these novel NVM technologies must overcome these ancillary challenges, while managing the lower latency and/or higher throughput of the device.

BRIEF DESCRIPTION OF THE DRAWINGS

Various embodiments of the invention are disclosed in the following detailed description and the accompanying drawings.

DETAILED DESCRIPTION

Figure 1:
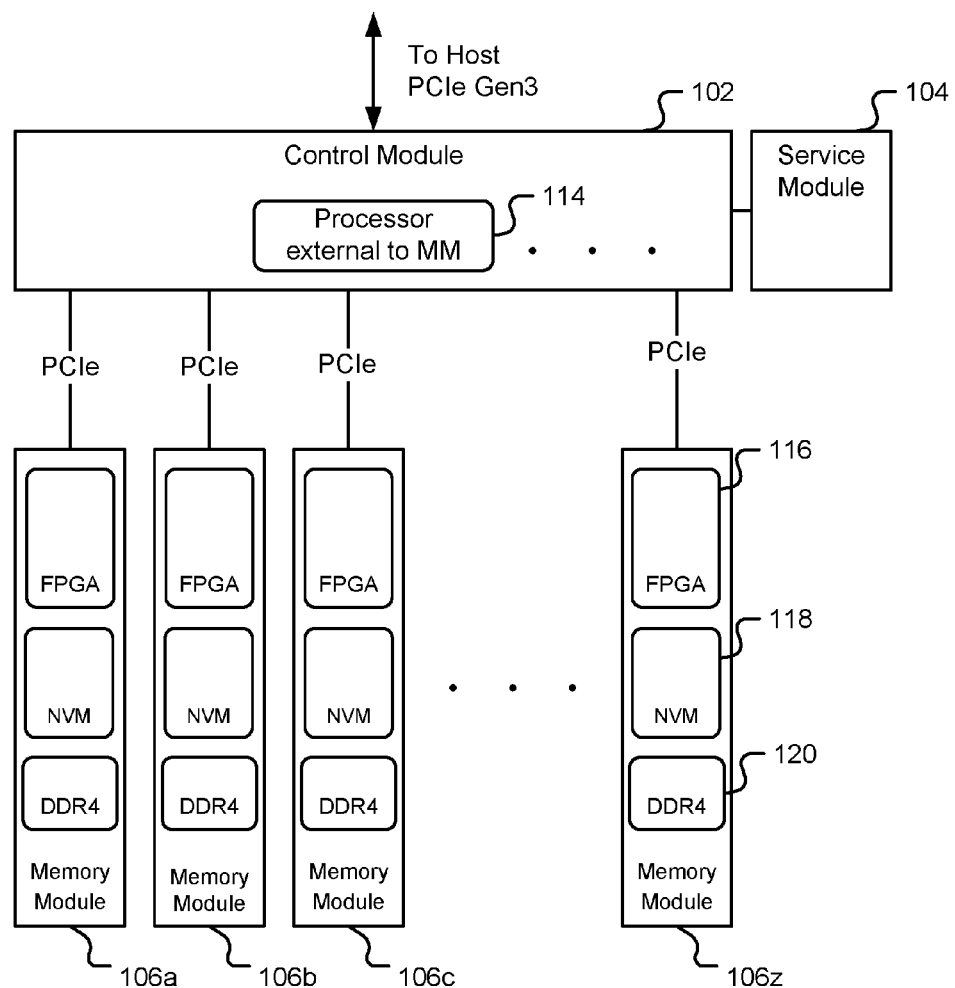
FIG. 1 is a block diagram illustrating an embodiment of a system for a memory access device.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Using an field programmable gate array (FPGA) for integration with a lower latency NVM is disclosed. An FPGA is a gate array device that may be programmed "in the field", after the gate array device has been manufactured. This is useful for integration with emerging technologies as an FPGA has the ability to reprogram once deployed. The utility of being able to do that with respect to emerging NVM device technologies is high: Emerging NVM technologies may not be fully or precisely characterized and/or the characteristics of which may change through and after development and integration design.

Traditionally a software programmable controller system-on-chip (SOC) is used for NAND-based flash memory, for example a PMC Princeton PCIe NVMe controller. Such a software programmable controller uses an internal CPU with firmware to integrate 8-32 independent flash channels, each for a flash memory device, with a host interface, typically PCIe, SATA, and/or SAS. An external SDRAM buffer, typically using DDR3 protocol, may be integrated to provide throughput matching between the flash channel bus and the host interface bus.

Recent NVM technologies include higher throughput and/or lower latency memories. In one embodiment, a lower latency NVM includes next generation memory, for example a memory technology that is a transistorless and/or resistive-based memory.

In one embodiment, a higher throughput/lower latency NVM provides the following advantages over flash memory:
  a. fully bit-addressable to allow reading and writing by bit rather than by block, for example providing write-in-place and rewrite-in-place instead of page-size rewrites, or read-modify-write, as with flash memory;
  b. more than 100 times lower latency than flash memory;
  c. higher throughput, for example 2100 MT/s or 150 ns/byte as compared to flash memory at 400 MT/s; and
  d. greater endurance and/or wear resistance than flash memory.

In one embodiment, a higher throughput/lower latency NVM may require differing procedures over traditional NAND-based flash NVM to handle:
  a. Device characteristics including settling time after writing a specific bit before being able to read, in the range of 1 usec to 300 ms.
  b. Wear leveling including using write-in-place/fully bit-addressable migration within a device or across a plurality of devices, handling different patterns;
  c. Physical location "disturb" tracking wherein a read and/or write access may disturb one of the physically adjacent bits;
  d. Error correction including handling different error patterns over flash;
  e. Tile replacement to handle remapping when tiles fail;
  f. Media scheduling control, for example using a start-gap algorithm; and
  g. Command mapping to provide backwards compatibility with older NVM technologies such as flash.

Throughout this specification a memory is fully "bit-addressable" if it allows a bit to be rewritten without having to rewrite other bits, for example read-modify-write as with flash memory.

An FPGA controller is a novel approach at controlling an emerging NVM technology to provide new parallelizable logic as new physical phenomena are discovered about the device. For example, flash traditionally uses a 40-bit BCH error correction coding (ECC) which research has determined to be most effective for channel coding for the NAND flash media. For emerging NVM technology it is conceivable not only that ECC parameters (40-bit to 64-bit, e.g.) but ECC algorithms/logic structures themselves (BCH to Reed Solomon, e.g.) may be updated as device statistics and error correlation characterization evolve over time.

With at least fifty times the performance of traditional NAND-based flash, emerging NVM technology may not be handled by existing software programmable controller SOC approaches. For example while a flash channel may be four bytes wide, an emerging NVM may be sixteen bytes wide. With up to 16 devices at, for example, currently at 150 ns/byte, a controller may need to handle 6.6 MB/sec per device or 106 MB/sec per controller. For control module (102) with 36 memory modules (106) this results in a 3.5 GB/s throughput chassis. An FPGA-based controller can handle such high throughput by parallelizing logic on a per channel basis, for example.

FIG. 1 is a block diagram illustrating an embodiment of a system for a memory access device.

The system comprises a control module (102) coupled to both a host/user/client, a service module (104) and a plurality of memory modules (106a-106z). In one embodiment, up to 36 memory modules (106) may be used. The control module uses a high throughput bus to couple to the host, for example PCIe Gen 3 with between x4 and x96 lanes. Within the control module (102) there are one or more processors (114) that are external to the memory modules (106a)-(106z). An external processor (114) may have one or more processing cores. An external processor (114) may be coupled internally using a lower throughput bus, for example PCIe 2.0 with x1 lane.

The control module (102) is coupled by PCIe to a memory module (106z), which comprises: an FPGA controller (116); a non-volatile memory media (118), and an associated DDR4 buffer/cache (120). In one embodiment, a non-volatile memory media (118) may include next generation non-volatile memory.

Figure 2:
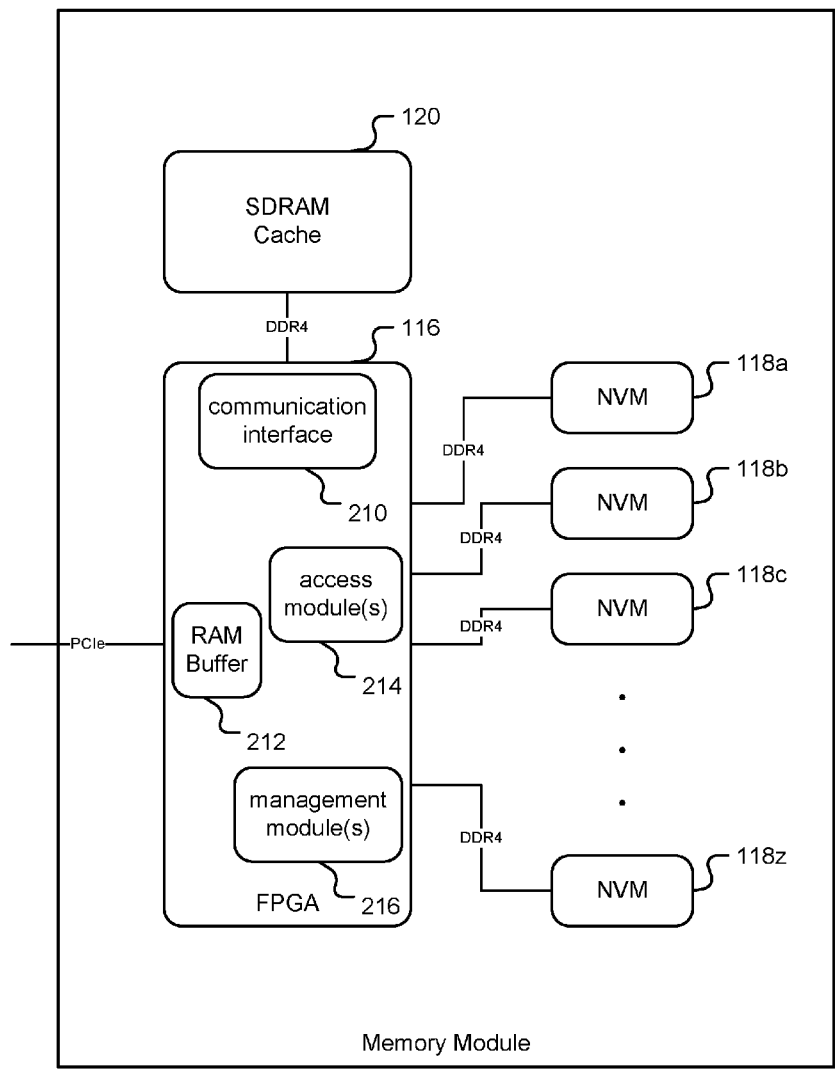
FIG. 2 is a block diagram illustrating an embodiment of system for a memory module.

FIG. 2 is a block diagram illustrating an embodiment of system for a memory module. As shown in FIG. 1, each memory module (106) comprises an FPGA (116) with 8-32 channels of NVM (118a-118z), and is coupled to an SDRAM (120).

In one embodiment, the FPGA (116) interfaces hostward via a PCIe bus, for example dual PCIe Gen3 x4, for a data rate up to 6 GB/s. The FPGA (116) interfaces using DDR4 with the SDRAM cache (120). The function of the settling time cache is to provide a host with a cache for reading within the settled time window. A typical settling time is 1 usec to 100 ms, so to enable a cache deep enough to store data for up to 100 ms and fast enough to absorb data at 6 GB/s, the settling time cache must be at least 6 GB/s×100 ms=600 MB in size with a 6 GB/s read/write bandwidth. A communication interface (210), for example an SDRAM controller logic block, within FPGA (116) is used to provide a high data transfer rate connection to the external RAM (120).

In one embodiment, DDR4 is also used to interface each device (118a, 118b, 118c, . . . 118z) to the FPGA (116). With a potential mismatch between the DDR4 deviceward bus and PCIe hostward bus, one or more RAM buffers (212) may be used to handle the throughput mismatch between the respective busses. FPGA field programmable logic blocks are used to provide one or more access modules (214) which provide access functions to the NVM modules (118a-118z). FPGA field programmable logic blocks are used to provide one or more management modules (216) which provide management functions to the NVM modules (118a-118z).

In one embodiment, the management function for a module (216) is forward error correction and/or ECC. For example, a BCH algorithm used for flash memory is based on error pattern and statistical error correlations that may be inappropriate for emerging NVM technologies. Forward error correction and/or ECC algorithms/machines/modules may be designed and improved by updating the FPGA and/or module (216) even after being deployed in the field.

In one embodiment, the management function for a module (216) is wear leveling. Unlike flash memory which requires read-modify-write over blocks of flash, emerging NVM may enable fully bit-addressable rewrite, for write-in-place. The module (216) may include field programmable algorithms/modules for wear detection and wear migration that resolve wear bit-by-bit.

In one embodiment, the management function for a module (216) is tile replacement. Using an FPGA (116) allows emerging NVM technology vendors to insert proprietary modules (216) to indicate when memory tiles are failing and require replacement. A tile replacement module (216) may take this indication and provide tile migration.

In one embodiment, the management function for a module (216) is media scheduling control. For example, a start-gap algorithm may be used when emerging NVM technologies only require mild wear leveling to avoid the higher complexity and lower performance of table-based methods for wear leveling. The start-gap uses a start and gap addressing register to gently migrate read/write access to spread out access, for example uniformly, over time to avoid 'hot spots'.

In one embodiment, the communication interface (210) and/or management function for module (216) includes a write settling time cache controller. For example, a settling period for an emerging NVM technology may increase from 1 usec to 100 ms. Using an FPGA (116) allows flexibility not only for caching algorithms, but also cache size and flexibility for new physical settling time characteristics to permit a new settling time cache characteristic.

In one embodiment, the access module (214) comprises a new NVM interface protocol to succeed DDR4. In one embodiment, the access module (214) comprises a new host interface protocol to succeed PCIe/NVMe, for example a proprietary protocol such as NVMd. Having a flexibility to change the interface protocols or other management modules (216) in the field based on new physical insights for the emerging NVM technology associated with the NVM modules (118a-118z) may provide dynamic improvements to reliability and performance of the memory module (106).

In one embodiment, a read access to given cell in the emerging NVM technology may affect the payload of the cell and/or one or more physically adjacent cells. For example for next generation memory, cells may be adjacent in three-dimensions, such that there are at least six near neighbors along the X-axis, Y-axis, and Z-axis. The phenomena where reading a cell causes errors in the cell or its adjacent cells is termed throughout this specification as "read disturb". Similarly, a write access to given cell may affect all physically adjacent cells and the phenomena where writing a cell causes errors in the cell or its adjacent cells is termed throughout this specification as "write disturb". The management module (216) may include algorithms/modules to minimize the deleterious effects of read disturb and write disturb.

Figure 3:
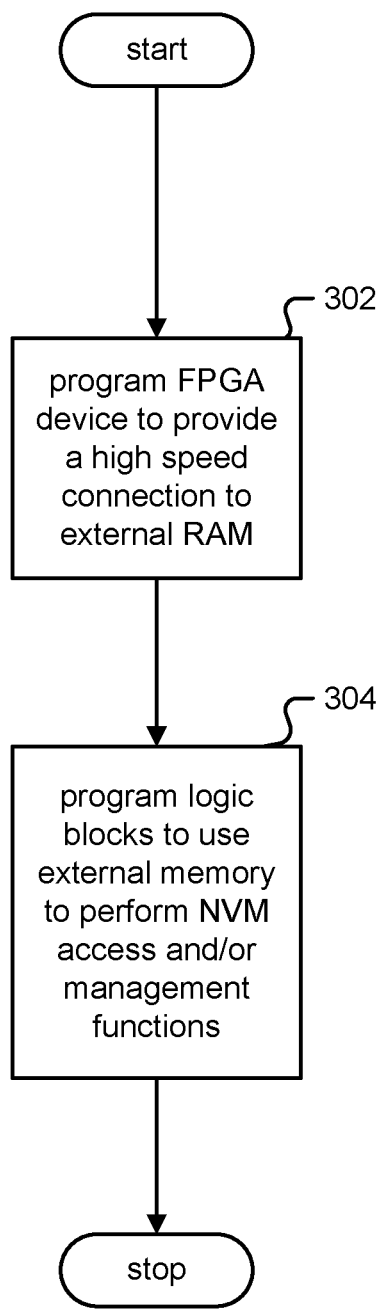
FIG. 3 is a flow chart illustrating an embodiment of a process for using an FPGA for integration with NVM.

FIG. 3 is a flow chart illustrating an embodiment of a process for using an FPGA for integration with NVM. In step 302, the FPGA is programmed to provide a high speed/data transfer rate connection and/or communication interface to an external random access memory device, wherein said at least a subset of FPGA programmable logic blocks are programmed in a first configuration to perform one of both of an access function and a management function at least in part using data sent via the communication interface, wherein the communication interface is coupled to at least a subset of the programmable logic blocks.

In step 304, a plurality of programmable logic blocks are programmed in the first configuration to perform one or both of the access function and the management function with respect to a plurality of non-volatile memory modules.

Figure 4:
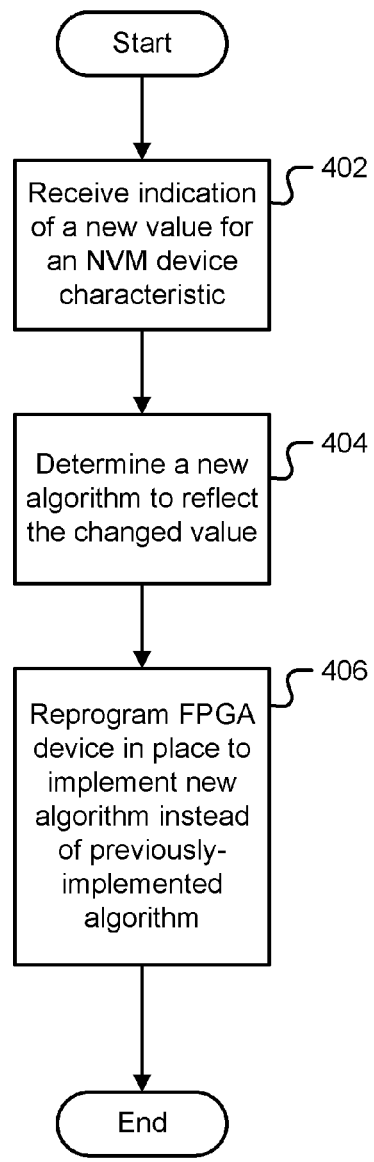
FIG. 4 is a flow chart illustrating an embodiment of a process for responding to new information about an NVM device.

FIG. 4 is a flow chart illustrating an embodiment of a process for responding to new information about an NVM device. In one embodiment, this process occurs with the designers of the system of FIG. 1 and/or FIG. 2.

In step 402, an indication of a new value for an NVM device (118) characteristic is received. For example, the manufacturer of an NVM device (118), for higher statistical reliability, may change the specification of the settling time cache from 1 ms to 100 ms. In step 404, a new algorithm and/or parameter is determined to reflect the changed value. In the example above, previously the settling time cache size was 6 GB/s×1 ms=6 MB. This may have fit within SDRAM available within the FPGA (116). An increase of one hundred times for the settling period may result in using the external SDRAM (120), and reprogramming the FPGA (116) to configure logic blocks for a communication interface (210) to handle the 600 MB settling time cache.

In step 406, the FPGA device (116) is reprogrammed in place (i.e. in the field) to implement the new algorithm instead of the previously-implemented algorithm. In the example above, the FPGA (116) is reprogrammed to expand the settling time cache from 6 MB to 600 MB.

Figure 5:
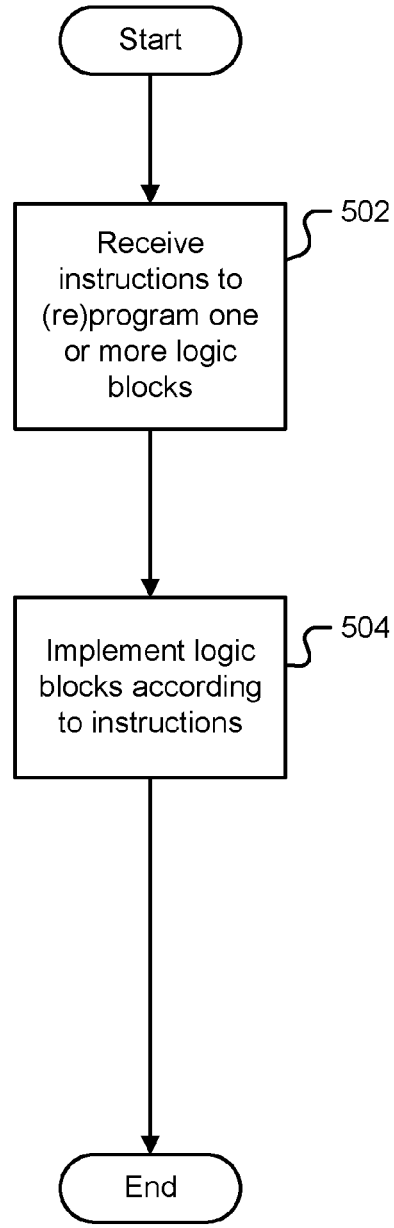
FIG. 5 is a flow chart illustrating an embodiment of a process for reprogramming an FPGA in place.

FIG. 5 is a flow chart illustrating an embodiment of a process for reprogramming an FPGA in place. In one embodiment, FIG. 5 is included in step 406 of FIG. 4.

In step 502, instructions are received to program and/or reprogram one or more logic blocks on FPGA (116). In one embodiment, instructions are received via a file transmitted to the field by physical media (e.g. a hard drive or thumb drive) or over the internet (e.g. email, web address, ftp site, etc).

In step 504, logic blocks in the FPGA (116) are implemented according to the instructions of step 502. In one embodiment, a hardware and/or software device is used to reconfigure the FPGA (116) via a logic block configuration bitstream, for example via an SD card, JTAG port, SPI interface, etc.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A field programmable gate array device comprising:
   a plurality of programmable logic blocks programmed in a first configuration to perform one or both of an access function and a management function with respect to a plurality of non-volatile memory modules; and
   a communication interface coupled to at least a subset of said programmable logic blocks and configured to provide a high data transfer rate connection to an external random access memory device, wherein said at least a subset of said programmable logic blocks are programmed in said first configuration to perform one or both of said access function and said management function at least in part using data sent via said communication interface,
   wherein the plurality of programmable logic blocks as configured in the first configuration implement a first algorithm to perform one or both of said access function and said management function and are further configured to be reprogrammed in place to be configured in a second configuration, instead of the first configuration, wherein the second configuration implements a second algorithm that replaces the first algorithm, and
   wherein the second algorithm comprises a new settling time cache characteristic.

2. The field programmable gate array device of claim 1, wherein the first configuration is to perform a plurality of access functions and a plurality of management functions in parallel.

3. The field programmable gate array device of claim 1, wherein the communication interface is DDR4.

4. The field programmable gate array device of claim 3, wherein a second communication interface to the plurality of non-volatile memory modules is DDR4.

5. The field programmable gate array device of claim 1, wherein the external random access memory device is SDRAM.

6. The field programmable gate array device of claim 5, wherein the external random access memory device is a settling time cache on SDRAM.

7. The field programmable gate array device of claim 1, wherein the management function is at least one of the following: forward error correction, ECC, wear leveling, and tile replacement.

8. The field programmable gate array device of claim 1, wherein the first algorithm comprises a first parameter value for a particular algorithm and the second algorithm comprises a second parameter value for the particular algorithm.

9. The field programmable gate array device of claim 1, wherein the second algorithm comprises a new wear leveling algorithm.

10. The field programmable gate array device of claim 1, wherein the second algorithm comprises a new cache size.

11. The field programmable gate array device of claim 1, wherein the second algorithm comprises a new caching algorithm.

12. The field programmable gate array device of claim 1, wherein the second algorithm comprises a new ECC characteristic.

13. The field programmable gate array device of claim 1, wherein the second algorithm comprises a new start gap implementation.

14. The field programmable gate array device of claim 1, wherein the second algorithm comprises a new non-volatile memory interface protocol.

15. The field programmable gate array device of claim 1, wherein the second algorithm comprises a parameter based on a new physical insight for a technology associated with the plurality of non-volatile memory modules.

16. The field programmable gate array device of claim 15, wherein the technology is a fully bit-addressable non-volatile memory.

17. A method, comprising:
programming a plurality of programmable logic blocks in a first configuration to perform one or both of an access function and a management function with respect to a plurality of non-volatile memory modules; and
providing a high data transfer rate connection to an external random access memory device, wherein said at least a subset of said programmable logic blocks are programmed in said first configuration to perform one or both of said access function and said management function at least in part using data sent via a communication interface, wherein the communication interface is coupled to at least a subset of said programmable logic blocks,
wherein the plurality of programmable logic blocks as configured in the first configuration implement a first algorithm to perform one or both of said access function and said management function and are further configured to be reprogrammed in place to be configured in a second configuration, instead of the first configuration, wherein the second configuration implements a second algorithm that replaces the first algorithm, and
wherein the second algorithm comprises a new settling time cache characteristic.

18. A computer program product, the computer program product being embodied in a non-transitory computer readable storage medium and comprising computer instructions for:
programming a plurality of programmable logic blocks in a first configuration to perform one or both of an access function and a management function with respect to a plurality of non-volatile memory modules; and
providing a high data transfer rate connection to an external random access memory device, wherein said at least a subset of said programmable logic blocks are programmed in said first configuration to perform one or both of said access function and said management function at least in part using data sent via a communication interface, wherein the communication interface is coupled to at least a subset of said programmable logic blocks,
wherein the plurality of programmable logic blocks as configured in the first configuration implement a first algorithm to perform one or both of said access function and said management function and are further configured to be reprogrammed in place to be configured in a second configuration, instead of the first configuration, wherein the second configuration implements a second algorithm that replaces the first algorithm, and
wherein the second algorithm comprises a new settling time cache characteristic.

* * * * *